(12) United States Patent
Holland et al.

(10) Patent No.: US 12,369,271 B2
(45) Date of Patent: Jul. 22, 2025

(54) COOLING SYSTEMS HAVING A CONDUIT AND A HEAT TRANSFER DEVICE FOR TRANSFERRING HEAT FROM AN ELECTRONIC COMPONENT

(71) Applicant: Lenovo Enterprise Solutions (Singapore) Pte Ltd., Singapore (SG)

(72) Inventors: Jeffrey Holland, Morrisville, NC (US); Arvind Modekurti, Morrisville, NC (US); Vinod Kamath, Morrisville, NC (US)

(73) Assignee: Lenovo Global Technology (United States) Inc., Morrisville, NC (US)

( * ) Notice: Subject to any disclaimer, the term of this patent is extended or adjusted under 35 U.S.C. 154(b) by 151 days.

(21) Appl. No.: 17/957,172

(22) Filed: Sep. 30, 2022

(65) Prior Publication Data
US 2024/0114651 A1    Apr. 4, 2024

(51) Int. Cl.
*H05K 7/20* (2006.01)
*G06F 1/20* (2006.01)

(52) U.S. Cl.
CPC .......... *H05K 7/20272* (2013.01); *G06F 1/20* (2013.01); *H05K 7/20509* (2013.01); *G06F 2200/201* (2013.01)

(58) Field of Classification Search
CPC .. H05K 7/20272; H05K 7/20509; G06F 1/20; G06F 2200/201
USPC ........................................................ 361/699
See application file for complete search history.

(56) References Cited

U.S. PATENT DOCUMENTS

| | | | | |
|---|---|---|---|---|
| 5,038,858 | A * | 8/1991 | Jordan | H01L 23/3672 165/185 |
| 6,141,216 | A * | 10/2000 | Holung | F28D 15/0266 361/679.52 |
| 7,007,741 | B2 * | 3/2006 | Sen | H01L 23/473 257/E23.09 |
| 7,151,668 | B1 * | 12/2006 | Stathakis | H01L 23/473 257/E23.098 |
| 7,457,118 | B1 * | 11/2008 | French | H05K 7/20936 361/679.48 |
| 7,755,897 | B2 * | 7/2010 | Chen | H01L 23/427 361/728 |
| 7,933,125 | B2 * | 4/2011 | Wei | H05K 7/20772 361/708 |
| 7,957,134 | B2 * | 6/2011 | Farnsworth | H01L 23/427 361/679.52 |

(Continued)

*Primary Examiner* — Anatoly Vortman
(74) *Attorney, Agent, or Firm* — Olive Law Group, PLLC

(57) ABSTRACT

Cooling systems having a conduit and a heat transfer device for transferring heat from an electronic component are disclosed. According to an aspect, a cooling system includes a conduit configured to be in conductive heat transfer interface with an electronic component. The conduit is configured to transfer a first portion of heat from the electronic component to a flow of a cooling liquid. The heat transfer device is also configured to be in conductive heat transfer interface with the electronic component, and to transfer a second portion of heat from the electronic component. The cooling system includes a heat collector manifold configured to receive the flow of the cooling liquid with the first portion of heat from the conduit, to receive the second portion of heat via conductive heat transfer from the heat transfer device, and to transfer the second portion of heat to the flow of the cooling liquid.

17 Claims, 9 Drawing Sheets

(56) References Cited

U.S. PATENT DOCUMENTS

| | | | | |
|---|---|---|---|---|
| 7,990,699 B2* | 8/2011 | Lian | ............... | F28D 15/0275 |
| | | | | 361/679.52 |
| 8,638,559 B2* | 1/2014 | Barina | ............... | H01L 23/427 |
| | | | | 361/679.52 |
| 9,245,820 B2* | 1/2016 | Goldrian | ............... | H01L 23/473 |
| 2003/0010477 A1* | 1/2003 | Khrustalev | ......... | F28D 15/0266 |
| | | | | 312/236 |
| 2003/0057546 A1* | 3/2003 | Memory | ............ | F28D 15/0266 |
| | | | | 257/706 |
| 2004/0037045 A1* | 2/2004 | Phillips | ............... | F28D 15/0233 |
| | | | | 361/719 |
| 2007/0201208 A1* | 8/2007 | Goodwin | ............... | G06F 1/20 |
| | | | | 257/E23.098 |
| 2008/0084668 A1* | 4/2008 | Campbell | ......... | H05K 7/20509 |
| | | | | 257/E23.098 |
| 2008/0291630 A1* | 11/2008 | Monh | ............... | H01L 23/427 |
| | | | | 361/700 |
| 2009/0002951 A1* | 1/2009 | Legen | ............... | H01L 23/427 |
| | | | | 165/104.33 |
| 2009/0277616 A1* | 11/2009 | Cipolla | ............... | H01L 23/473 |
| | | | | 165/104.33 |
| 2010/0025010 A1* | 2/2010 | Cipolla | ............... | H01L 23/4093 |
| | | | | 165/47 |
| 2010/0188809 A1* | 7/2010 | Hsu | ............... | H01L 23/3672 |
| | | | | 361/679.54 |
| 2021/0302074 A1* | 9/2021 | Artman | ............... | F25B 21/04 |
| 2023/0363112 A1* | 11/2023 | Pokharna | ............ | F28D 15/0275 |

* cited by examiner

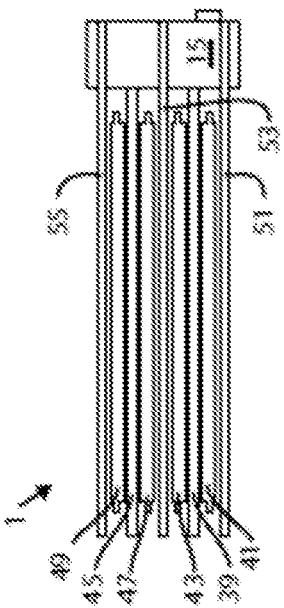
FIG. 8A
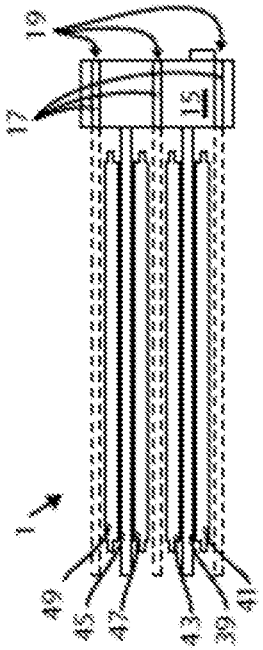
FIG. 8B
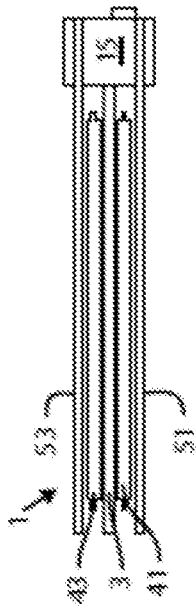
FIG. 9A
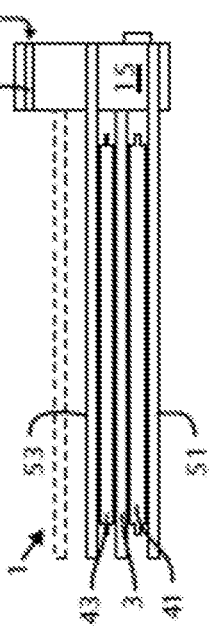
FIG. 9B
FIG. 10A
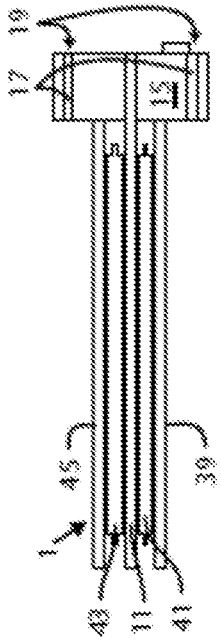
FIG. 10B

COOLING SYSTEMS HAVING A CONDUIT AND A HEAT TRANSFER DEVICE FOR TRANSFERRING HEAT FROM AN ELECTRONIC COMPONENT

TECHNICAL FIELD

The presently disclosed subject matter relates generally to cooling systems for computing devices. Particularly, the presently disclosed subject matter relates to cooling systems having a conduit and a heat transfer device for transferring heat from an electronic component.

BACKGROUND

Computing devices require cooling systems that are more efficient than cooling by fan or ambient air cooling. Proper cooling of computing devices is needed to maintain optimal performance and extend their time of usage. Servers usually require better cooling performance than provided by fan or ambient air cooling.

For servers, liquid cooling systems are often used. These cooling systems often use conduits that carry cooling liquid in proximity to electronic components that need cooling. A conduit can transfer heat away from an electronic component to thereby cool the component.

Conduits are mechanical components and therefore cannot easily be dynamically configured during final manufacturing stages to reduce cost if a system's configuration does not require high cooling capabilities. For at least this reason, there is a need for liquid cooling system that can be easily configured depending on system requirements.

BRIEF DESCRIPTION OF THE DRAWINGS

Figure 1A:
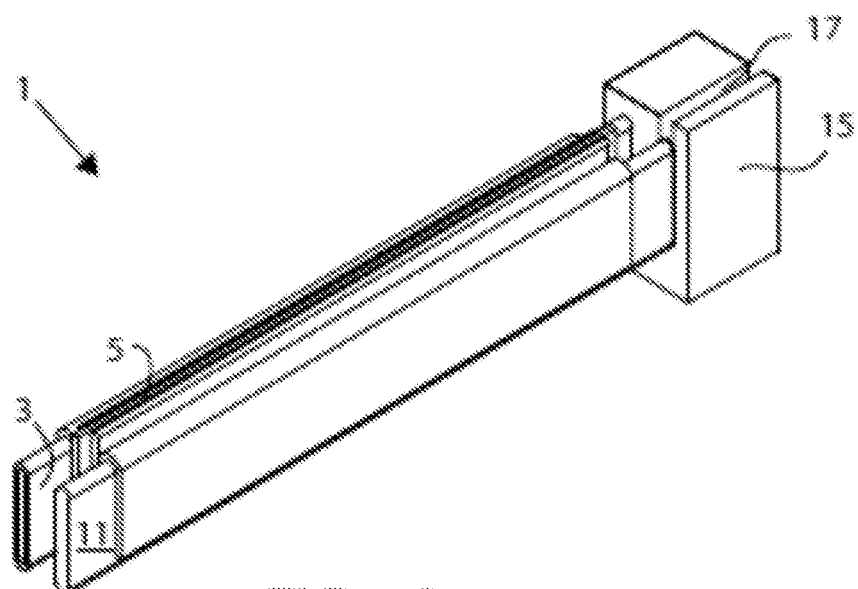
Figure 1B:
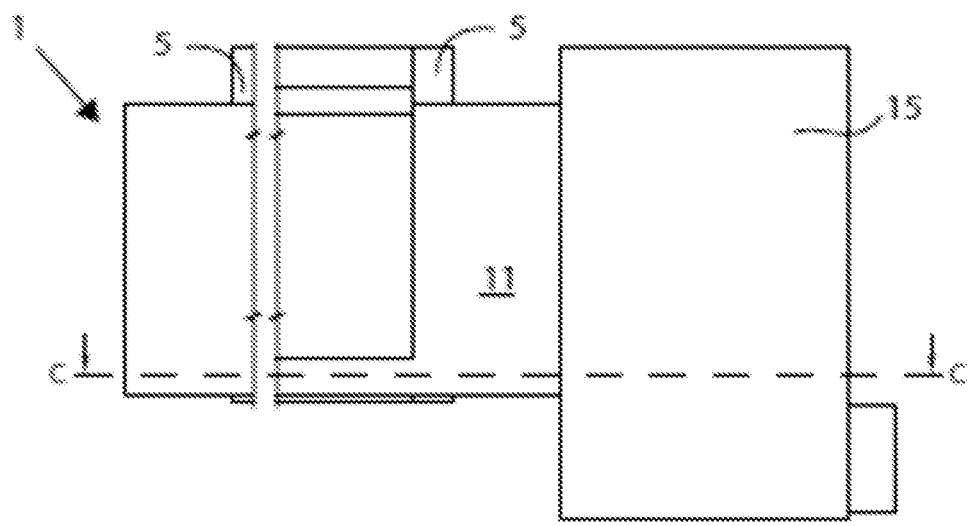
Figure 1C:
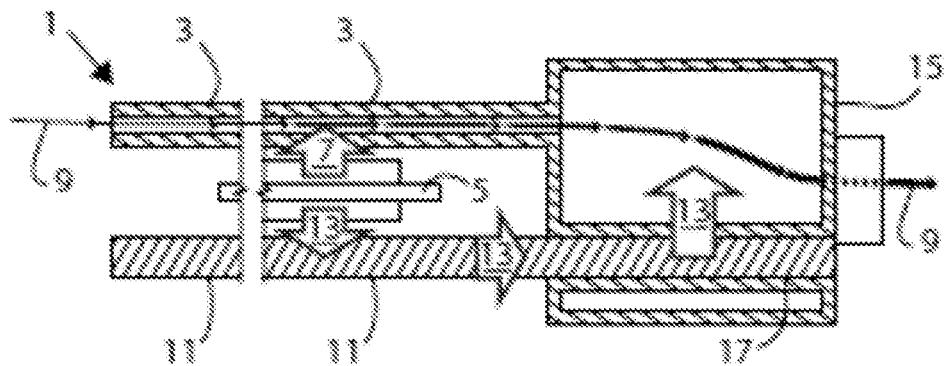
Figure 2A:
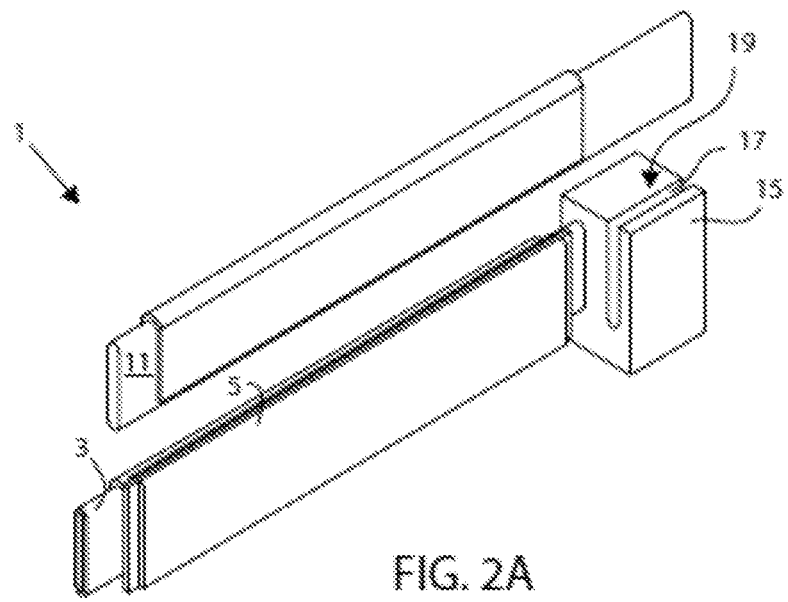
Figure 2B:
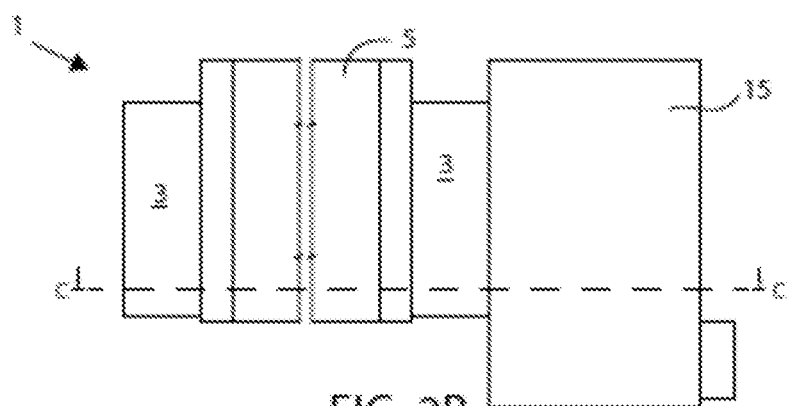
Figure 2C:
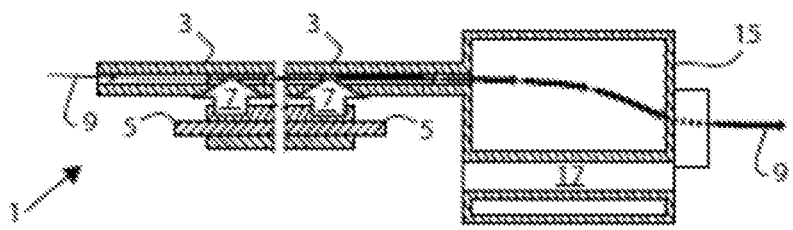
Figure 3A:
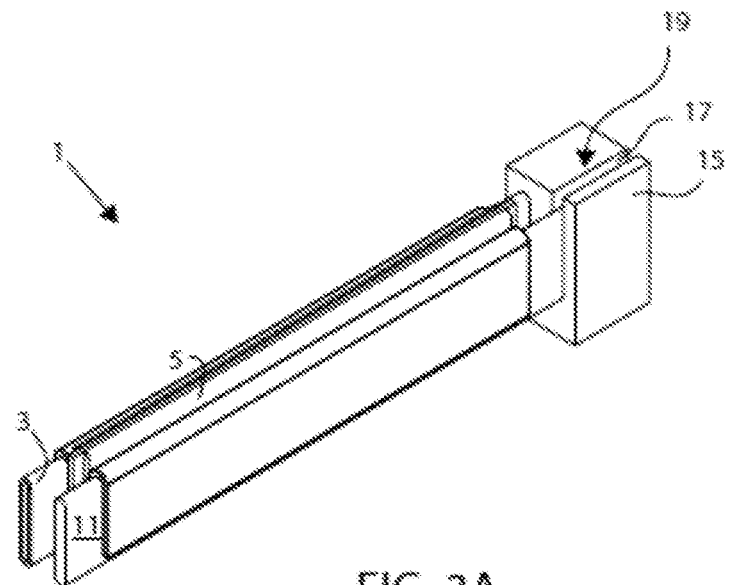
Figure 3B:
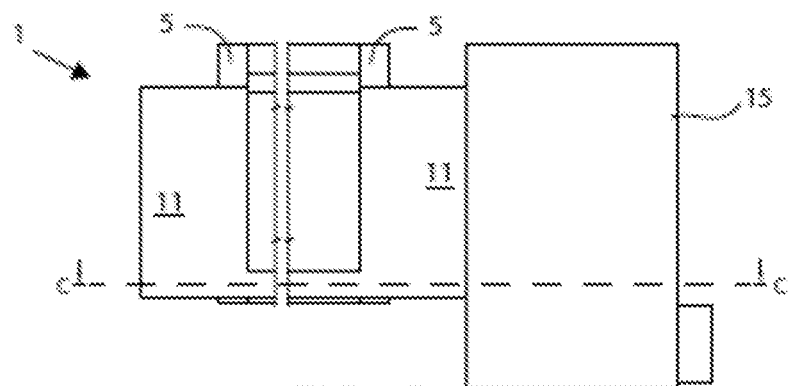
Figure 3C:
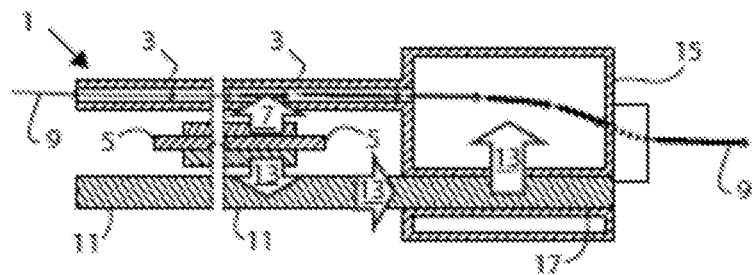
Figure 4A:
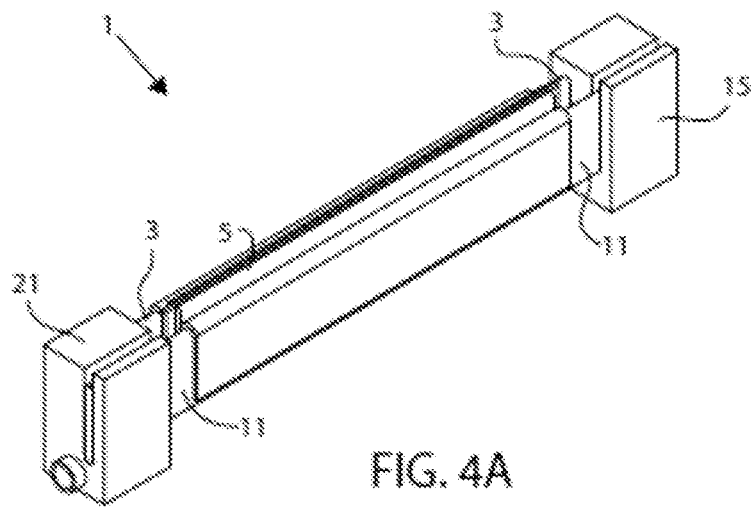
Figure 4B:
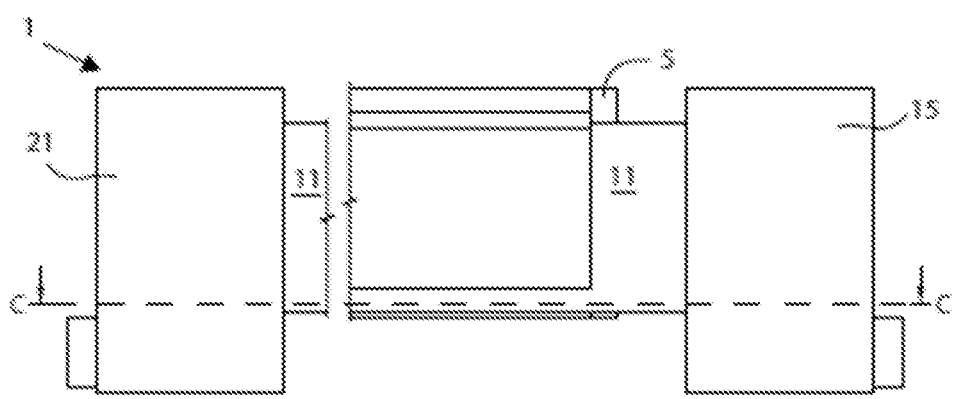
Figure 4C:
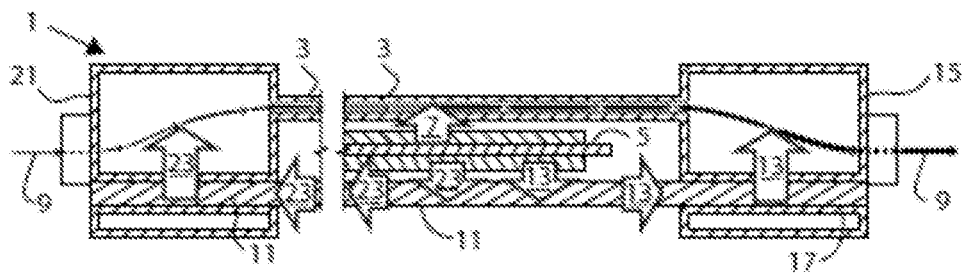
Figure 5A:
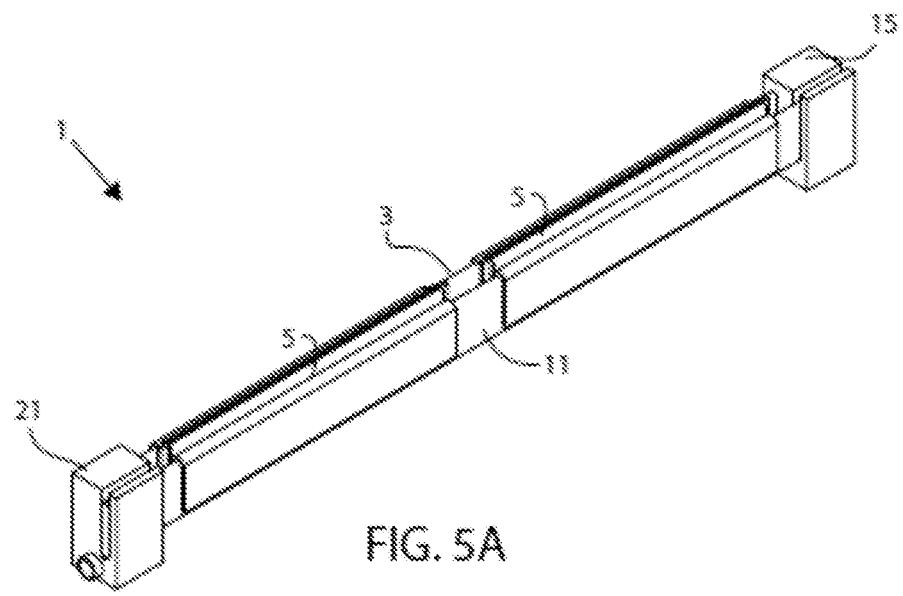
Figure 5B:
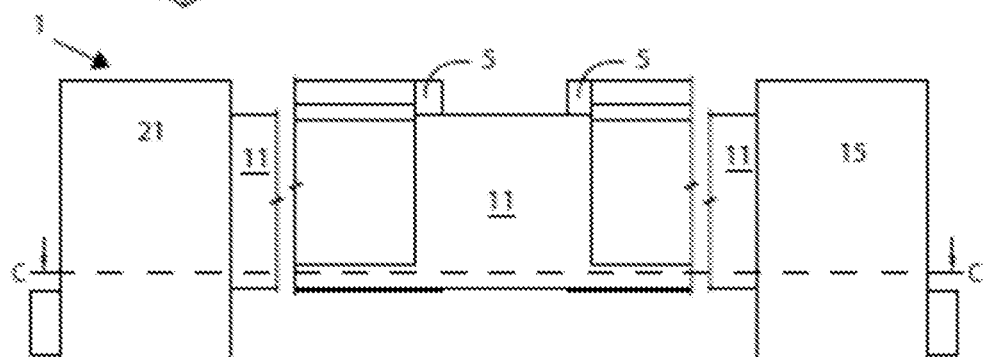
Figure 5C:
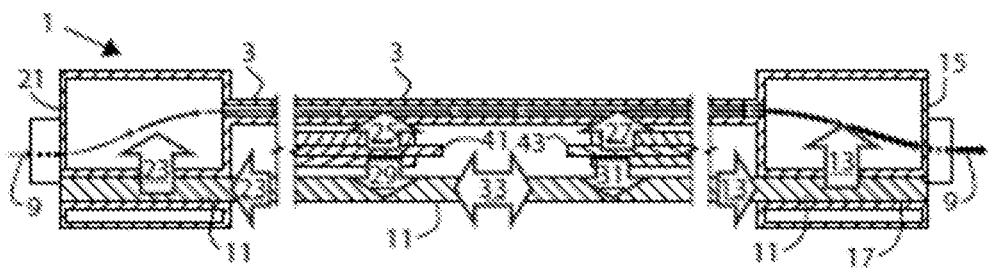
Figure 6A:
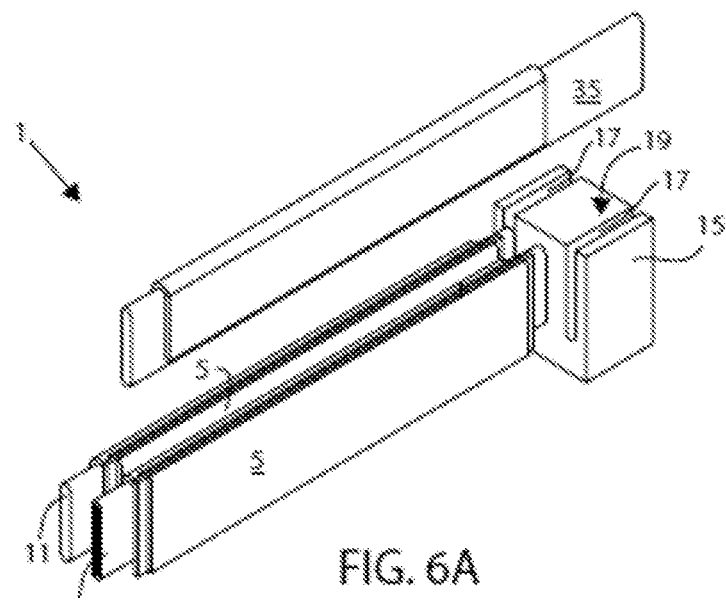
Figure 6B:
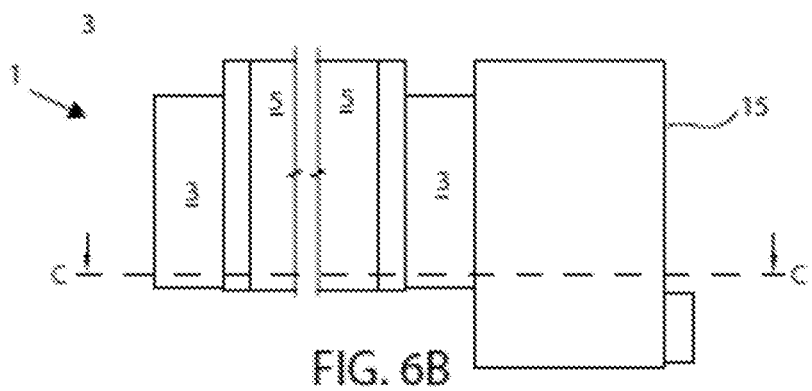
Figure 6C:
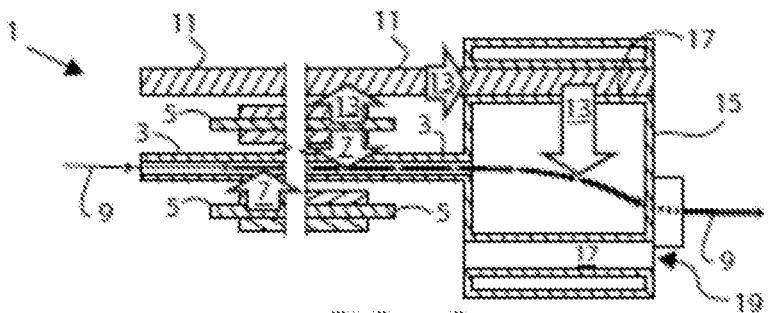
Figure 7A:
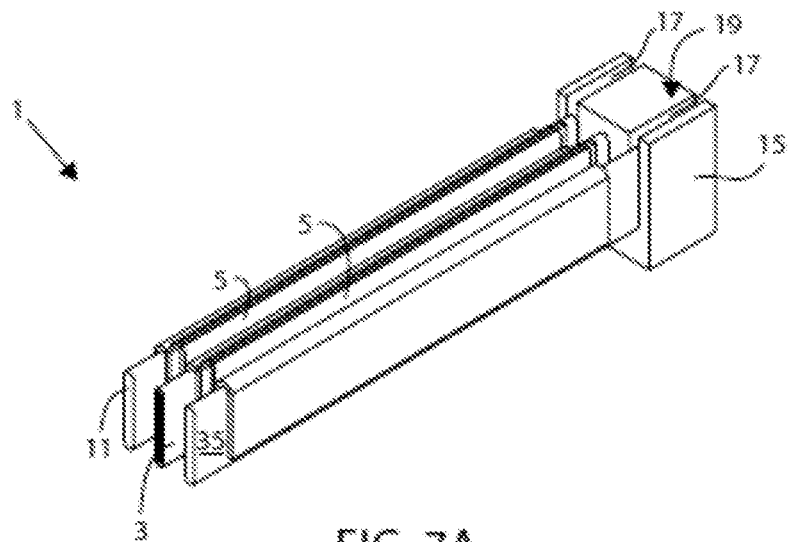
Figure 7B:
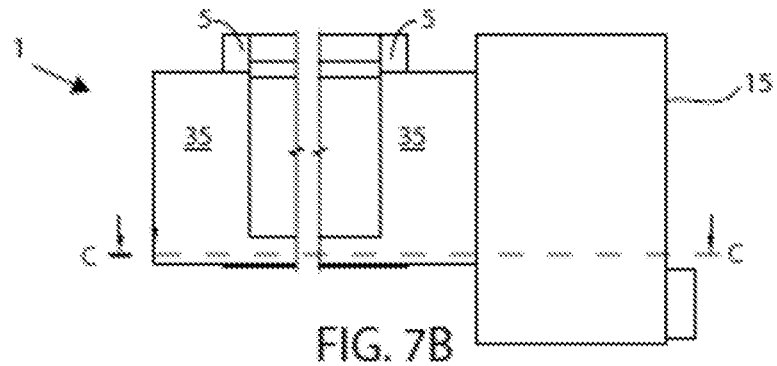
Figure 7C:
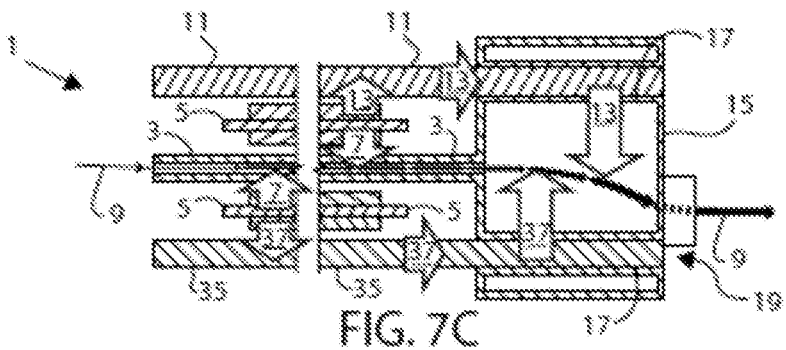
Figure 11A:
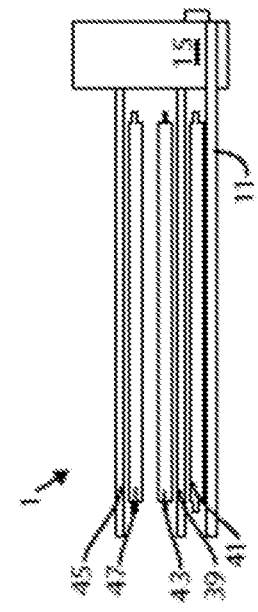
Figure 12A:
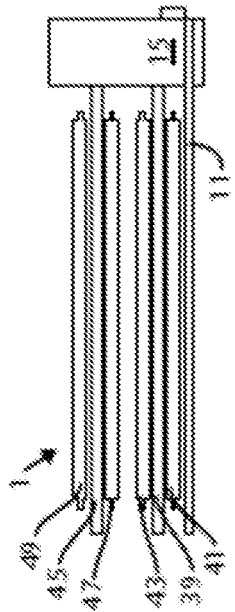
Figure 13A:
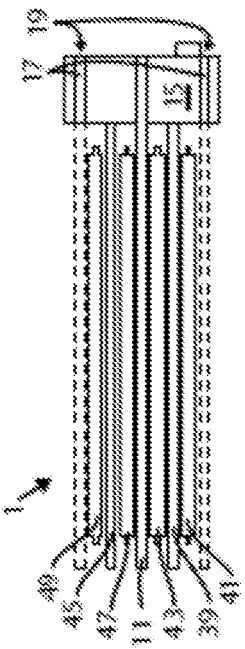
Figure 11B:
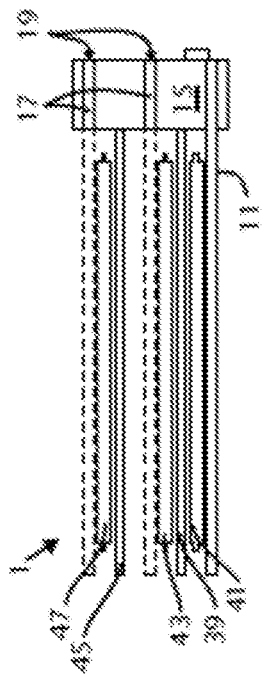
Figure 12B:
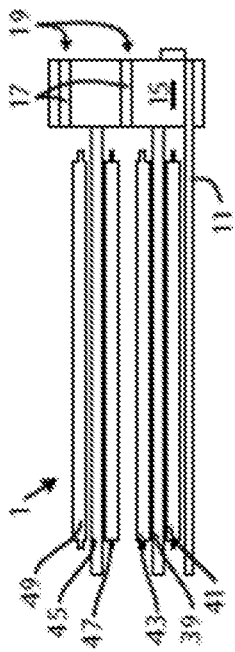
Figure 13B:
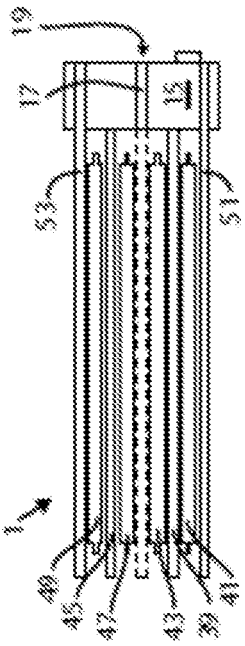

Having thus described the presently disclosed subject matter in general terms, reference will be made to the accompanying Drawings, which are not necessarily drawn to scale, and wherein:

FIGS. 1A-1C are perspective, side, and section views of a cooling system for an electronic component, comprising a conduit, a heat transfer device, and a heat collector manifold;

FIGS. 2A-2C are perspective, side, and section views of a cooling system for an electronic component, comprising a conduit, and a heat collector manifold configured to receive a heat transfer device;

FIGS. 3A-3C are perspective, side, and section views of a cooling system for an electronic component, comprising a conduit, a heat collector manifold configured to receive a heat transfer device, and a heat transfer device received on the collector manifold;

FIGS. 4A-4C are perspective, side, and section views of a cooling system for an electronic component, comprising a conduit, a heat transfer device, a heat collector manifold, and a heat pre-collector module;

FIGS. 5A-5C are perspective, side, and section views of a cooling system for two electronic components, comprising a conduit, a heat transfer device, a heat collector manifold, and a heat pre-collector module;

FIGS. 6A-6C are perspective, side, and section views of a cooling system (for two electronic components), comprising a conduit, a heat transfer device, a heat collector manifold (configured to receive an additional heat transfer device), without an additional heat transfer device received by the heat collector manifold;

FIGS. 7A-C are perspective, side, and section views of a cooling system (for two electronic components), comprising a conduit, a heat transfer device, a heat collector manifold (configured to receive an additional heat transfer device), with an additional heat transfer device received by the heat collector manifold;

FIG. 8A is a top view of a cooling system for cooling plural electronic components in heat transfer interface with two conduits and a heat collector manifold configured to receive plural heat transfer devices, and with three heat transfer devices in heat transfer interface with the electronic components received by the heat collector manifold;

FIG. 8B is a top view of a cooling system for cooling plural electronic components in heat transfer interface with two conduits and a heat collector manifold configured to receive plural heat transfer devices, and indicating plural locations at which the manifold is configured to receive three heat transfer devices;

FIG. 9A is a top view of a cooling system for cooling plural electronic components in heat transfer interface with a conduit, and a heat collector manifold configured to receive plural heat transfer devices, and with two heat transfer devices in heat transfer interface with the electronic components received by the heat collector manifold;

FIG. 9B is a top view of a cooling system for cooling plural electronic components in heat transfer interface with a conduit, and a heat collector manifold configured to receive plural heat transfer devices, with two heat transfer devices in heat transfer interface with the electronic components received by the heat collector manifold, and indicating an additional location at which the manifold is configured to receive an additional heat transfer device;

FIG. 10A is a top view of a cooling system for cooling plural electronic components, with two electronic components in heat transfer interface with two conduits, and a heat collector manifold configured to receive an additional heat transfer device, and a heat transfer device in heat transfer interface with the two electronic components, received by the heat collector manifold;

FIG. 10B is a top view of a cooling system for cooling plural electronic components, with two electronic components in heat transfer interface with two conduits, and a heat collector manifold configured to receive plural additional heat transfer devices, and a heat transfer device in heat transfer interface with the two electronic components, received by the heat collector manifold, and indicating additional locations at which the manifold is configured to receive additional heat transfer devices;

FIGS. 11A-11B are top views of a cooling system for cooling plural electronic components, with three electronic components in heat transfer interface with two conduits, and a heat collector manifold configured to receive plural additional heat transfer devices, and a heat transfer device in heat transfer interface with one of the electronic components, received by the heat collector manifold, and indicating additional locations at which the manifold is configured to receive additional heat transfer devices;

FIGS. 12A-12B are top views of a cooling system for cooling plural electronic components, with four electronic components in heat transfer interface with two conduits, and a heat collector manifold configured to receive plural additional heat transfer devices, and a heat transfer device in heat transfer interface with one of the electronic components, received by the heat collector manifold, and indicating additional locations at which the manifold is configured to receive additional heat transfer devices; and FIGS. 13A-13B are top views of a cooling system for cooling plural electronic components, with four electronic components in heat transfer interface with two conduits, and a heat collector manifold configured to receive plural additional heat transfer devices, and a heat transfer device in heat transfer interface with two of the electronic components, received by the heat collector manifold, and indicating an additional location at which the manifold is configured to receive an additional heat transfer device.

SUMMARY

The presently disclosed subject matter is directed to cooling systems having a conduit and a heat transfer device for transferring heat from an electronic component. According to an aspect, a cooling system includes a conduit configured to be in conductive heat transfer interface with an electronic component. The conduit is also configured to transfer a first portion of heat from the electronic component to a flow of a cooling liquid. The cooling system also includes a heat transfer device extending parallel to the conduit. The heat transfer device is also configured to be in conductive heat transfer interface with the electronic component. Further, the heat transfer device is configured to transfer a second portion of heat from the electronic component. The cooling system also includes a heat collector manifold configured to receive the flow of the cooling liquid with the first portion of heat from the conduit. The heat collector manifold is also configured to receive the second portion of heat via conductive heat transfer from the heat transfer device. Further, the heat collector manifold is configured to transfer the second portion of heat to the flow of the cooling liquid.

According to another aspect, a cooling system includes a conduit configured to be in conductive heat transfer interface with an electronic component. The conduit is also configured to transfer a first portion of heat from the electronic component to a flow of a cooling liquid. Further, the system includes a heat collector manifold configured to receive the flow of the cooling liquid with the first portion of heat from the conduit. An exterior of the heat collector manifold comprises a conductive module contact region, configured to alternately receive and not receive a heat transfer device thereon, such that the heat collector manifold is configured to receive a second portion of heat via conductive heat transfer from the heat transfer device, and to transfer the second portion of heat to the flow of the cooling liquid, when the heat transfer device is received in the conductive module contact region and is in conductive heat transfer interface with the electronic component.

DETAILED DESCRIPTION

The following detailed description is made with reference to the figures. Exemplary embodiments are described to illustrate the disclosure, not to limit its scope, which is defined by the claims. Those of ordinary skill in the art will recognize a number of equivalent variations in the description that follows.

Articles "a" and "an" are used herein to refer to one or to more than one (i.e. at least one) of the grammatical object of the article. By way of example, "an element" means at least one element and can include more than one element.

"About" is used to provide flexibility to a numerical endpoint by providing that a given value may be "slightly above" or "slightly below" the endpoint without affecting the desired result.

The use herein of the terms "including," "comprising," or "having," and variations thereof is meant to encompass the elements listed thereafter and equivalents thereof as well as additional elements. Embodiments recited as "including," "comprising," or "having" certain elements are also contemplated as "consisting essentially of" and "consisting" of those certain elements.

Recitation of ranges of values herein are merely intended to serve as a shorthand method of referring individually to each separate value falling within the range, unless otherwise indicated herein, and each separate value is incorporated into the specification as if it were individually recited herein. For example, if a range is stated as between 1%-50%, it is intended that values such as between 2%-40%, 10%-30%, or 1%-3%, etc. are expressly enumerated in this specification. These are only examples of what is specifically intended, and all possible combinations of numerical values between and including the lowest value and the highest value enumerated are to be considered to be expressly stated in this disclosure.

Unless otherwise defined, all technical terms used herein have the same meaning as commonly understood by one of ordinary skill in the art to which this disclosure belongs FIGS. 1A-IC are a perspective view, a side view, and a section view, respectively, of an exemplary cooling system 1 for an electronic component 5. The cooling system 1 includes a conduit 3, a heat transfer device 11, and a heat collector manifold 15. Referring to FIGS. 1A-IC, the conduit 3 is configured to be in conductive heat transfer interface with the electronic component 5. Although only one electronic component is shown in this example, it should be appreciated that the conduit 3 may be in conductive heat transfer interface with more than one electronic component. The conduit 3 can transfer a first portion of heat 7 from the electronic component 5 to a flow of a cooling liquid 9.

Note that the thickness of the curved line of arrows indicating the flow of the cooling liquid 9 varies along its path, to suggest changes in the relative amount of heat carried by the cooling liquid 9 at any particular location with respect to the various components of the cooling system 1. It is not meant to indicate changes in flow rate or any other property.

Some exemplary electronic components contemplated but should be considered non-limiting include, but are not limited to, elongate planar printed circuit boards (PCBs) and memory units, sticks, or modules. The heat transfer device 11 extends parallel to the conduit 3, and is configured to be in conductive heat transfer interface with the one or more electronic components 5. The heat transfer device 11 is also configured to transfer a second portion of heat 13 from the electronic component 5 by its conductive heat transfer interface arrangement to the electronic component.

The heat collector manifold 15 is configured to receive the flow of the cooling liquid 9 with the first portion of heat 7 from the conduit 3, as well as to receive the second portion of heat 13 via conductive heat transfer from the heat transfer device 11. The heat collector manifold 15 can transfer the second portion of heat 13 to the flow of the cooling liquid 9.

The heat transfer device 11 can be placed in a position to receive heat transfer from the electronic component 5 by fitting an end within the conductive module contact region 17. The heat transfer device 11 can provide additional heat transfer from the electronic component 5. Further, the heat transfer device 11 can be removed from the shown position by moving it in an upward direction to release it from the conductive module contact region 17.

FIGS. 2A-2C and 3A-3C refer to similar exemplary embodiments but are distinguished by the absence and presence, respectively, of the heat transfer device 11. FIGS. 2A-2C are a perspective view, a side view, and a section view, respectively, of the exemplary cooling system 1 for the electronic component 5. The cooling system 1 includes the conduit 3 and the heat collector manifold 15. The heat collector manifold 15 is configured to receive the heat transfer device 11, which is not shown in FIGS. 2B and 2C, but it is shown in FIGS. 3A-3C.

Now turning to FIGS. 3A-3C, these figures show are a perspective view, a side view, and a section view, respectively, of the cooling system 1 for the electronic component 5. The cooling system includes a conduit 3 and a heat collector manifold 15. The heat transfer device 11 can be received with the conductive module contact region 17.

With reference to FIGS. 3A-3C, the conduit 3 can be in conductive heat transfer interface with the electronic component 5. Further, the conduit 3 can transfer a first portion of heat 7 from the one or more electronic components 5 to a flow of the cooling liquid 9. Some exemplary electronic components that are contemplated but which should be considered non-limiting on the present invention include elongate planar PCBs and memory units, sticks, or modules.

The heat collector manifold 15 is configured to receive the flow of the cooling liquid 9 with the first portion of heat 7 from the conduit 3, wherein the exterior of the heat collector manifold 15 comprises at least one conductive module contact region 17. The at least one conductive module contact region 17 is configured to alternately receive and not receive a heat transfer device 11 thereon.

In accordance with embodiments, the module contact region 17 can define a recess 19 that can fit to and contactingly engage securely against slip from the heat collector manifold 15. The recess 19 can define or have any of the following example shapes: a slot, a channel, a pocket, a cavity, a valley, a U-shaped slot, and a negative curvature space of sufficient and consistent width to receive by vertical insertion an object having a cross section shape. The defined shape can be a rectangle having a predominant width and height, and which is abutted on one side defined by the width value of a semicircular area with a radius equal to half the width.

Turning to FIG. 2A, the cooling system 1 is shown alongside an exemplary heat transfer device 11, for which the heat collector manifold 15 is configured to receive. It is shown approximately vertically offset from where the heat collector manifold 15 is configured to receive the heat transfer device 11, insofar as it is also vertically offset specifically with respect to the recess 19 and conductive module contact region 17. It is noted that in FIGS. 2B-2C, the heat transfer device (11, see FIG. 2A, 3A-C) is not in view.

Turning to FIG. 2C, for the lack of a heat transfer device received with respect to the conductive module contact region 17, there is a lack of a second portion of heat (13, See FIGS. 1C, 3C) to be transferred to the flow of the cooling liquid 9 (note the unobstructed visibility of the conductive module contract regions 17), and only a first portion of heat 7 is transferred to the conduit 3 to the flow of cooling liquid 9. Therefore, as the cooling liquid 9 exits from the cooling system 1 at the outlet from the heat collector manifold 15, it only contains heat energy which was transferred in the first portion of heat 7.

As a further note: for circumstances under which electronic components 5 of FIGS. 2C and 3C generate any particular specific amount of heat, and the respective cooling systems 1 dissipate that amount of heat from the respective electronic components 5, where heat energy in FIG. 2C is not transferred as a second portion of heat (13, FIGS. 1C, 3C), the magnitude of the first portion of heat 7 in FIG. 2C would have to be equal to the sum of the first portion of heat 7 and second portion of heat 13 in FIG. 3C. This distinction is alluded-to in the comparison of FIG. 2C and FIG. 3C by the depiction of two first portions of heat 7. However, the presence of two arrows labeled with the same reference number is not strictly meant to imply that there is more than one first portion of heat 7 present in FIG. 2C. It is merely a suggestion, as a visual cue for comparison against FIG. 3C, so that FIG. 3C is not misunderstood to indicate a cooling system 1 that necessarily provides only a higher heat dissipation than the system shown in FIG. 2C. Neither system should be construed as being limited to any fixed amount of cooling capacity or that either is necessarily limited to a performance level that is in excess of the other. Also, the rate of cooling by the flow of cooling liquid is not fixed. For example, the rate of flow of the cooling liquid 9 may be varied, in order to increase the cooling capacity or decrease the cooling capacity of any of the cooling systems 1 in the present figures.

FIGS. 3A-3C, by contrast to FIGS. 2A-2C, illustrate an exemplary embodiment of a cooling system 1 that does include a heat transfer device 11, as received by the heat collector manifold 15, by the conductive module contact region (not visible here, see 17, FIG. 2C) receiving the heat transfer device 11 thereon. In FIG. 3C, it can be seen that the heat transfer device 11 is in conductive heat interface with the electronic component 5.

Thereby, while arranged as shown in FIGS. 3A-3C, when the conductive module contact region 17 (see FIGS. 2A, 2C, and 3A) receives a heat transfer device 11 that is in conductive heat transfer interface with the one or more electronic components 5, the heat collector manifold 15 is configured to receive at least a second portion of heat 13 via conductive heat transfer from the heat transfer device 11, and to transfer the second portion of heat 13 to the flow of the cooling liquid 9.

Contemplated embodiments also supported by elements shown in FIGS. 2A-2C and 3A-3C are accurately described by considering that the present embodiment cooling system 1 is one for which the exterior of the heat collector manifold 15 comprises a conductive module contact region 17 configured to receive the heat transfer device 11 thereon, to receive the second portion of heat 13, via conductive heat transfer from the heat transfer device 11, therethrough.

FIGS. 4A-4C illustrates a perspective view, a side view, and a section view, respectively, of a cooling system 1 for an electronic component 5, comprising a conduit 3, a heat transfer device 11, a heat collector manifold 15, and a heat pre-collector manifold 21. The heat pre-collector manifold 21 is configured to provide the flow of cooling liquid 9 (otherwise similarly shown in FIGS. 1A, 1C, 2A, 2C, 3A, and 3C) to the conduit 3.

As in FIGS. 1A-IC and FIGS. 3A-3C, the heat transfer device 11 is in heat transfer interface with the electronic component 5. However, here, the heat transfer device 11 is also in heat transfer interface with the heat pre-collector manifold 21 (Similar to the manner of the heat transfer device 11 and heat collector manifold 15, also shown here, see also as described with respect to FIG. 3C). Thereby, insofar as the electronic component 5 produces heat that can be identified as a cumulation of portions of heat, a third portion of heat 23 is received by the pre-collector manifold 21 via conductive heat transfer from the heat transfer device 11.

It is also noted that the pre-collector manifold 21 can transfer the third portion of heat 23 to the flow of the cooling liquid 9. This is upstream of the heat transfer interface of the conduit 3 with the electronic component 5.

Therefore, FIG. 4C shows an embodiment of the present invention which provides embodiments that may be configured to extend the site of heat generation into a series of sequential stages with greater contact area with a single flow of cooling liquid 9. Heat is transferred away from both sides of the electronic component 5 shown. A first portion 7 is transferred from one side, to the liquid directly through the conduit into the flow of liquid 9, where the conduit 3 is in heat transfer interface with the electronic component 5. Heat is simultaneously transferred from the opposite side of the electronic component, directly into the heat transfer device 11. The heat transferred here is merely represented as distinct second and third portions 13 and 23 of this amount of heat. They do not differ in source or in the general nature or characteristics of heat.

In embodiments where the heat transfer device 11 is in heat transfer interface with both a heat collector manifold 15 and a heat pre-collector manifold 21, this heat can be characterized as being the sum of a second portion 13 and a third portion 23 of heat. The 2nd portion 13 is transferred downstream (relative to the direction of flow of the cooling liquid 9) to the heat collector manifold 15. The flow of liquid 9 thereby already contains the first portion of heat 7 when the second portion 13 is transferred into the flow of liquid 9. The third portion 23 is therefore transferred upstream to the heat pre-collector manifold 21. According to this labeling scheme, this means that the third portion 23 is transferred to the liquid 9 before the liquid 9 contains either of the first portion 7 and the second portion 13.

In several contemplated embodiments, heat transfer devices, such as heat transfer device 11, may employ such rapidly-conducting and convecting technologies as convective heat pipes, and heat pipes encased or cast into conductive metal members, such that heat transferred away from the electronic component 5 by a heat transfer device 11 may equal or exceed the rate at which heat can be transferred away from the electronic component 5 by a conduit 3. Thereby, transferring the heat received by the heat transfer device 11 into the upstream and downstream liquid in sequential stages, the system 1 can provide a sort of unfolding of the heat transferring interfaces of an electronic component 5 emitting heat from two opposite sides into an object of two (or three) sub-lengths (that is twice as long), but only emits heat on one side, such that all of the heat emitting sides can be arranged sequentially, and transfer each respective portion of heat into a singular length of conduit for which each portion has a sequential stage of heat transfer interface along that singular length.

FIGS. 5A-5C illustrate a perspective view, a side view, and a section view, respectively, of a cooling system 1 for two electronic components 41 and 43, comprising a conduit 3, a heat transfer device 11, a heat collector manifold 15, and a heat pre-collector manifold 21. Now turning to FIGS. 5A-5C, the conduit 3 is in conductive heat transfer interface with a first and a second of the electronic components 41, 43 arranged sequentially along the length of the conduit 3 and configured to sequentially transfer an upstream portion 25 of the first portion of heat and a downstream portion 27 of the first portion of heat from the first electronic component 41 and second electronic component 43, respectively, to the flow of the cooling liquid 9.

The heat transfer device 11 is in conductive heat transfer interface with the first and second of the electronic components 41, 43, opposite the conduit 3. The heat transfer device 11 can also contemporaneously transfer, in parallel, a first module heat portion 29 and a second module heat portion 31 from the first and second electronic component 41, 43, respectively, into a total internal module heat 33, and respectively dissipate heat of the total internal module heat 33 into the second portion of heat 13 to the heat collector manifold 15 and the third portion of heat 23 to the heat pre-collector manifold 21.

FIGS. 6A-6C and 7A-7C refer to similar exemplary embodiments but are distinguished by the absence and presence, respectively, of an additional heat transfer device. Particularly, FIGS. 6A-6C illustrate a perspective view, a side view, and a section view, respectively, a cooling system 1 for two electronic components 5. The cooling system 1 includes a conduit 3, a heat transfer device 11, and a heat collector manifold 15 (configured to receive an additional heat transfer device), without an additional heat transfer device received by the heat collector manifold.

FIGS. 7A-C illustrate a perspective view, a side view, and a section view, respectively, a cooling system for two electronic components. The cooling system includes a conduit, a heat transfer device, a heat collector manifold (configured to receive an additional heat transfer device), with an additional heat transfer device received by the heat collector manifold.

FIGS. 6A-6C and 7A-7C illustrate an exemplary cooling system 1, similar to that of FIGS. 1A-IC, wherein the exterior of the heat collector manifold 15 has at least one conductive module contact region 17 configured to alternately receive and not receive an additional heat transfer device 35 thereon. In this regard, the heat collector manifold 15 can receive an additional portion of heat 37 via conductive heat transfer from the additional heat transfer device 35 when the conductive module contact region 17 receives an additional heat transfer device 35 that is in conductive heat transfer interface with the one or more electronic components 5.

Referring now to FIG. 6C, of the two electronic components 5 shown, one is in heat transfer interface with solely the conduit 3. The other of the two electronic components 5 is also in heat transfer interface with the heat transfer device 11. The conduit 3 thereby receives a first portion of heat 7 from each of the electronic components 5, and the heat transfer device 11 receives a second portion of heat 13 from only one of the electronic components 5. Thereafter, the first portions of heat 7 from the two electronic components 5 are transferred into the flow of cooling liquid 9, and the second portion of heat 13 is conducted through the heat transfer device 11, and conducted from the heat transfer device 11 to the heat collector manifold 15 via the conductive module contact region 17, and finally conducted into the flow of cooling liquid 9. The flow of cooling liquid 9 thereafter exits the heat collector manifold 15, carrying all of the first and second portions of heat (7, 13) out of the system 1.

The heat collector manifold 15 shown has a recess 19 comprising an additional heat-transfer contact region 17, but it is not in contact with an additional heat transfer device 35 (See FIGS. 6A and 7A-7C)

Referring now to FIG. 7C, there is shown a cooling system 1 that is similar to FIGS. 6A-6C, except that there is an additional heat transfer device 35 received into the recess 19 on the heat transfer collector 15, in contact with the conductive module contact region 17, such that the additional heat transfer device 35 is in heat transfer interface with the heat collector manifold 15. This embodiment therefore arranges the additional heat transfer device 35 in heat transfer interface with both the electronic component 5 that was otherwise only cooled by contact with the conduit in FIGS. 6A-6C, as well as in heat transfer interface with the heat collector manifold 15.

In this arrangement, the cooling system 1 is thereby enabled to transfer a second portion of heat 13 from one of the electronic components 5, and an additional portion of heat 37 from the other of the electronic components 5. As a result, the flow of cooling liquid 9 exiting the system 1 carries at least all of the following, with respect to each of the electronic components 5: a first portion of heat 7 and one of a second portion of heat 7 and an additional portion of heat 37.

FIGS. 8A-13B illustrate top views of exemplary embodiments of cooling systems 1 for cooling plural electronic components (5, 41, 43, 47, 49 as specified) in heat transfer interface with either or both plural conduits (conduit 3, first conduit 39, second conduit 45 as specified) and plural heat transfer devices (11, 35, 51, 53, or 55, as specified). Except as specified (FIG. 10A), each of the exemplary embodiments of cooling systems 1 for each of FIGS. 8A-13B comprise a heat collector manifold 15 that is configured to receive plural heat transfer devices (i.e. heat transfer device 11, additional module 35, first module 51, second module 53, or third module 55, as specified), in heat transfer interface with electronic components (i.e. component 5, first component 41, second component 43, third component 47, or fourth component 49, as specified) to collect portions of heat (See 7, 13, 37, FIGS. 1C, 2C, 3C, 4C, 6C, and 7C) therefrom, as specified, respectively.

Except for embodiments of the cooling system 1 among FIGS. 8A-13B which have not received a heat transfer device (FIG. 8B, indicated by dotted lines, as necessary for description), the heat collector manifolds 15 transfer portions of heat via conductive module contact regions 17 in the recesses 19 on the exteriors of the collector manifolds' 15, and thereon to a cooling flow of liquid 9. As elsewhere recited above, such portions of heat transferred from the electronic components (5, 41, 43, 47, 49 as specified) include at least first portions 7 of heat, via conductive heat transfer interface between the electronic components (5, 41, 43, 47, 49 as specified) and the conduits (3, 39, or 45, as specified), respectively.

All of FIGS. 8A-13B depict embodiments comprising recesses 19 on the heat collector manifolds 15, but the recesses 19 and their conductive contact regions 17 are only labeled in the figures where these components are not obstructed from these top views of the respective cooling systems 1. Also, while the exemplary embodiments of distinct cooling systems 1 shown in FIGS. 8A-13B are arranged to foster perception of them cumulatively, to emphasize the potential for modularity of specification supported in the common scope of invention intended, the diverse embodiments are nevertheless to be interpreted as merely exemplary and non-limiting upon the present invention. For example, for each of the cooling systems 1 depicted in FIGS. 8A-13B, respectively similar embodiments are contemplated that may include features and components found among the embodiments depicted in FIGS. 1A-7C (e.g. heat pre-collector manifold 21, FIGS. 4A-C; multiple electronic components 41, 43 in heat transfer interface with a common conduit 3, see FIGS. 5A-5C) that are otherwise not discussed in the descriptions for each of FIGS. 8A-13B which follow, below.

Referring now to FIGS. 8A-8B, the drawings show top views of cooling systems 1 for cooling plural electronic components 5 in heat transfer interface with two conduits 3 and a heat collector manifold 15 configured to receive plural heat transfer devices. FIG. 8A shows a cooling system 1 with three heat transfer devices (51, 53, 55) in heat transfer interface with electronic components (41, 43, 47, 49) received by the heat collector manifold 15. FIG. 8B shows a similar cooling system 1 without any heat transfer devices, and thereby show unobstructed view of recesses 19 (and their conductive contact regions 17) on the exterior of the heat collector manifold 15. Potential locations for heat transfer devices, for which the heat collector manifold 15 is configured to receive, are indicated by dotted lines.

Specifically, in FIG. 8A, the conduit comprises a first conduit 39 between a first and a second of the electronic components (41, 43) and a second conduit 45 between a third and a fourth of the electronic components (47, 49). Further, the heat transfer device comprises a first heat transfer device 51 proximate to the first electronic component 41 opposite the first conduit 39, a second heat transfer device 53 between the second and third electronic components (43, 47), and a third heat transfer device 55 proximate to the fourth electronic component 49, opposite the second conduit 45.

Referring now to FIGS. 9A and 9B, the drawings show top views of distinct cooling systems 1 for cooling plural electronic components (41, 43) in heat transfer interface with a conduit 3, and a heat collector manifold 15 configured to receive plural heat transfer devices, and with two heat transfer devices (51, 53) in heat transfer interface with the electronic components (41, 43) received by the heat collector manifold 15.

Specifically, FIG. 9A shows a cooling system 1, wherein the conduit 3 is between a first and a second of the electronic components (41 and 43, respectively), and wherein the heat transfer device comprises a first heat transfer device 51 proximate to the first electronic component 41, opposite the conduit 3, a second heat transfer device 53 proximate to the second electronic component 43, opposite the conduit 3.

FIG. 9B further shows a top view of a cooling system 1 for cooling plural electronic components (41, 43) in heat transfer interface with a conduit 3, and a heat collector manifold 15 configured to receive plural heat transfer devices, with two heat transfer devices (51, 53) in heat transfer interface with the electronic components (41, 43) received by the heat collector manifold 15, and indicating an additional location (in dotted lines) at which the heat collector manifold 15 is configured to receive an additional heat transfer device (35, See FIGS. 6A and 7A-C). Specifically, the heat collector manifold 15 is configured to receive an additional module with respect to heat transfer interface with the heat collector manifold 15, via a conductive contact region 17 of a recess 19 on the exterior of the heat collector manifold 15. Also, unlike FIG. 9A, the cooling system 1 of FIG. 9B is configured to optionally comprise a second conduit (indicated by dotted lines).

FIG. 10A illustrates a top view of a cooling system 1 for cooling plural electronic components, with two electronic components (41, 43) in heat transfer interface with two conduits (39, 45), and a heat collector manifold 15 configured to receive an additional heat transfer device, and a heat transfer device 11 in heat transfer interface with the two electronic components (41,43), received by the heat collector manifold 15.

Specifically, FIG. 10A illustrates a cooling system 1, wherein the heat transfer device 11 is between a first and a second of the electronic components (41, 43), and wherein the conduit comprises a first conduit 39 proximate to the first electronic component 41 opposite the heat transfer device 11, and a second conduit 45 proximate to the second electronic component 43, opposite the heat transfer device 11.

FIG. 10B illustrates a top view of a cooling system 1 for cooling plural electronic components, with two electronic components (41, 43) in heat transfer interface with two conduits (39, 45), and a heat collector manifold 15 configured to receive plural additional heat transfer devices, and a heat transfer device 11 in heat transfer interface with the two electronic components (41, 43), received by the heat collector manifold 15, and indicating additional locations at which the manifold is configured to receive additional heat transfer devices. Specifically, contact regions 17 and recesses 19 provide locations for additional heat transfer devices (35, see FIGS. 6A and 7A-7C).

FIGS. 11A and 11B together illustrate top views of exemplary embodiments of a cooling system 1 for cooling plural electronic components, with three electronic components (41, 43, 47) in heat transfer interface with two conduits (39, 45), and a heat collector manifold 15 (configured to receive plural additional heat transfer devices in FIG. 11B), and a heat transfer device 11 in heat transfer interface with one of the electronic components (here, 41), received by the heat collector manifold 15, and indicating additional locations at which the manifold 15 is configured to receive additional heat transfer devices (locations indicated by dotted outlines in FIG. 11B).

Specifically, FIG. 11A shows a cooling system 1, wherein the conduit comprises a first conduit 39 between a first and a second of the electronic components (41, 43) and a second conduit 45 proximate a third of the electronic components 47, opposite the second electronic component 43; and wherein the heat transfer device 11 is proximate to the first electronic component 41, opposite the first conduit 39.

Specifically, FIG. 11B further illustrates an alternative location for the third electronic component 47, still opposite the second electronic component 43, but on the opposite side of the second conduit 45, (relative to its location in FIG. 11A). Also shown in FIG. 11B are recesses 19 with contact regions 17 (compatible with cooling system 1 of FIG. 11A, but not depicted in FIG. 11A), such that collector manifold 15 is configured to receive plural additional heat transfer devices (35, see FIGS. 6A, 7A-7C).

FIGS. 12A and 12B together illustrate top views of exemplary embodiments of a cooling system 1 for cooling plural electronic components, with four electronic components (41, 43, 47, 49) in heat transfer interface with two conduits (39, 45), and a heat collector manifold 15 (configured to receive plural additional heat transfer devices in FIG. 12B), and a heat transfer device 11 in heat transfer interface with one of the electronic components (here, 41), received by the heat collector manifold 15, and indicating additional locations at which the manifold 15 is configured to receive additional heat transfer devices (locations indicated by dotted outlines in FIG. 12B).

Specifically, FIG. 12A illustrates a cooling system 1, wherein the conduit 3 comprises a first conduit 39 between a first and a second of the electronic components 5 and a second conduit 45 between a third and a fourth of the electronic components (47, 49); and wherein the heat transfer device 11 is proximate to the first electronic component 41, opposite the first conduit 39.

FIG. 12B further illustrates a further embodiment of a cooling system 1, having two additional recesses 19 with contact regions 17 (compatible with cooling system 1 of FIG. 12A, but not depicted in FIG. 12A), such that collector manifold 15 is configured to receive plural additional heat transfer devices (see additional heat transfer devices 35, FIGS. 6A, 7A-7C).

FIGS. 13A and 13B together illustrate top views of cooling systems 1 for cooling plural electronic components, with four electronic components (41, 43, 47, 49) in heat transfer interface with two conduits (39, 45), and a heat collector manifold 15 configured to receive plural additional heat transfer devices (see below for distinctions in heat transfer devices), and a heat transfer device (see below) in heat transfer interface with two of the electronic components, received by the heat collector manifold 15, and indicating at least one additional location at which the manifold is configured to receive an additional heat transfer device (not shown here, see additional heat transfer device 35, FIGS. 6A and 7A-7C).

In particular, FIG. 13A illustrate, with respect to the four electronic components (41, 43, 47, 49) shown, a heat transfer device 11 in heat transfer interface with the innermost two electronic components (43, 47) and indicates two locations (dotted lines) for receiving additional heat transfer devices (35, see FIGS. 6A, 7A-C), corresponding to where they would be received into the recesses 19 and in heat transfer interface with contact regions 17 on the heat collector manifold 15.

The embodiment shown in FIG. 13B, by contrast, uses plural heat transfer devices (51, 53), with respect to the outermost two of the electronic components (41, 49), and indicates a single location for an additional heat transfer device (see 35, FIGS. 6A and 7A-7C).

Specifically, FIG. 13B illustrates an embodiment of an exemplary cooling system 1, wherein the conduit comprises a first conduit 39 between a first and a second of the electronic components (41, 43) and a second conduit 45 between a third and a fourth of the electronic components (47, 49), and wherein the heat transfer device comprises a first heat transfer device 51 proximate to the first electronic component 41 opposite the first conduit 39, and a second heat transfer device 53 proximate to the fourth electronic component 49, opposite the second conduit 45.

While the embodiments have been described in connection with the various embodiments of the various figures, it is to be understood that other similar embodiments may be used, or modifications and additions may be made to the described embodiment for performing the same function without deviating therefrom. Therefore, the disclosed embodiments should not be limited to any single embodiment, but rather should be construed in breadth and scope in accordance with the appended claims.

What is claimed is:

1. A cooling system comprising:
a conduit in conductive heat transfer interface with an electronic component to transfer a first portion of heat from the electronic component to a flow of a cooling liquid, wherein the conduit is positioned adjacent to a first side of the electronic component;
a heat transfer device that extends parallel to the conduit and adjacent to a second side of the electronic component that opposes the first side of the electronic component that the conduit is adjacent to, wherein the heat transfer device is in conductive heat transfer interface with the electronic component, and wherein the heat transfer device transfers a second portion of heat from the electronic component; and a heat collector manifold that is affixed to the conduit, that receives the flow of the cooling liquid with the first portion of heat from the conduit, that receives the second portion of heat via conductive heat transfer from the heat transfer device, and that transfers the second portion of heat to the flow of the cooling liquid, wherein heat collector manifold comprises a slot that fits an end of the heat transfer device, and wherein heat transfer device is attachable and removable from the slot of the heat collector manifold.

2. The cooling system of claim 1, wherein an exterior of the heat collector manifold comprises a contact region of the heat collector manifold that receives the heat transfer device thereon to receive the second portion of heat via conductive heat transfer from the heat transfer device therethrough.

3. The cooling system of claim 1, further comprising a heat pre-collector manifold configured to provide the flow of cooling liquid to the conduit, to receive a third portion of heat via conductive heat transfer from the heat transfer device, and to transfer the third portion of heat to the flow of the cooling liquid upstream of the conductive heat transfer interface of the conduit with the electronic component.

4. The cooling system of claim 3, wherein the electronic component is a first electronic component,
wherein the conduit is in conductive heat transfer interface with the first electronic component and a second electronic component arranged sequentially along a length of the conduit,
wherein the conduit is configured to sequentially transfer an upstream portion of the first portion of heat and a downstream portion of the first portion of heat from the first electronic component and second electronic component, respectively, to the flow of the cooling liquid, and
wherein the heat transfer device is in conductive heat transfer interface with the first and second electronic components, opposite the conduit, and configured to contemporaneously transfer in parallel portions of the second portion of heat from the first and second electronic components, and dissipate portions of a combined heat of the second portion of heat to the heat collector manifold and to the heat pre-collector manifold.

5. The cooling system of claim 1, wherein an exterior of the heat collector manifold comprises a second conductive module contact region configured to alternately receive and not receive an additional heat transfer device thereon, such that the heat collector manifold is configured to receive an additional portion of heat via conductive heat transfer from the additional heat transfer device when the additional heat transfer device is received in the second conductive module contact region and is in conductive heat transfer interface with an additional electronic component.

6. The cooling system of claim 1, wherein the electronic component is a first electronic component,
wherein the conduit comprises a first conduit between the first electronic component and a second electronic component and a second conduit between a third electronic component and a fourth electronic component, and
wherein the heat transfer device comprises a first heat transfer device proximate to the first electronic component opposite the first conduit, a second heat transfer device between the second and third electronic components, and a third heat transfer device proximate to the fourth component, opposite the second conduit.

7. The cooling system of claim 1, wherein the electronic component is a first electronic component,
wherein the conduit is between the first electronic component and a second electronic component, and
wherein the heat transfer device comprises a first heat transfer device proximate to the first electronic component, opposite the conduit, and a second heat transfer device proximate to the second electronic component, opposite the conduit.

8. The cooling system of claim 1, wherein the electronic component is a first electronic component,
wherein the heat transfer device is between the first electronic component and a second electronic component, and
wherein the conduit comprises a first conduit proximate to the first electronic component opposite the heat transfer device, and a second conduit proximate to the second electronic component, opposite the heat transfer device.

9. The cooling system of claim 1, wherein the electronic component is a first electronic component,
wherein the conduit comprises a first conduit between the first electronic component and a second electronic component and a second conduit proximate a third electronic component, opposite the second electronic component, and
wherein the heat transfer device is proximate to the first electronic component, opposite the first conduit.

10. The cooling system of claim 1, wherein the electronic component is a first electronic component,
wherein the conduit comprises a first conduit between the first electronic component and a second electronic component and a second conduit between a third and a fourth electronic component, and
wherein the heat transfer device is proximate to the first electronic component, opposite the first conduit.

11. The cooling system of claim 1, wherein the electronic component is a first electronic component,
wherein the conduit comprises a first conduit between the first electronic component and a second electronic component and a second conduit between a third and a fourth electronic component, and
wherein the heat transfer device comprises a first heat transfer device proximate to the first electronic component opposite the first conduit, and a second heat transfer device proximate to the fourth electronic component, opposite the second conduit.

12. A cooling system comprising:
a conduit in conductive heat transfer interface with an electronic component to transfer a first portion of heat from the electronic component to a flow of a cooling liquid, wherein the conduit is positioned adjacent to a first side of the electronic component; and
a heat collector manifold that is affixed to the conduit, that receives the flow of the cooling liquid with the first portion of heat from the conduit,
wherein an exterior of the heat collector manifold defines a slot that fits an end of a heat transfer device, wherein the heat transfer device is positioned adjacent to a second side of the electronic component that opposes the first side of the electronic component, wherein the heat collector manifold comprises a contact region, that alternately receives and does not receive a heat transfer device thereon by placement of the end of the heat transfer device into and out of the slot, such that the heat collector manifold receives a second portion of heat via conductive heat transfer from the heat transfer device, and that transfers the second portion of heat to the flow of the cooling liquid, when the heat transfer device is received in the contact region and is in conductive heat transfer interface with the electronic component, wherein the heat transfer device is in conductive heat transfer interface with the second side of the electronic component.

13. The cooling system of claim 12, further comprising a heat pre-collector manifold configured to provide the flow of cooling liquid to the conduit, to receive a third portion of heat via conductive heat transfer from the heat transfer device, and to transfer the third portion of heat to the flow of the cooling liquid upstream of the conductive heat transfer interface of the conduit with the electronic component.

14. The cooling system of claim 13, wherein the electronic component is a first electronic component,
wherein the conduit is in conductive heat transfer interface with the first electronic component and a second electronic component arranged sequentially along a length of the conduit,
wherein the conduit is configured to sequentially transfer an upstream portion of the first portion of heat and a downstream portion of the first portion of heat from the first electronic component and second electronic component, respectively, to the flow of the cooling liquid, and
wherein the heat transfer device is in conductive heat transfer interface with the first and second electronic components, opposite the conduit, and configured to contemporaneously transfer in parallel portions of the second portion of heat from the first and second electronic components, and dissipate portions of a combined heat of the second portion of heat to the heat collector manifold and to the heat pre-collector manifold.

15. The cooling system of claim 12, wherein an exterior of the heat collector manifold comprises a second conductive module contact region configured to alternately receive and not receive an additional heat transfer device thereon, such that the heat collector manifold is configured to receive an additional portion of heat via conductive heat transfer from the additional heat transfer device when the additional heat transfer device is received in the second conductive module contact region and is in conductive heat transfer interface with an additional electronic component.

16. The cooling system of claim 12, wherein the electronic component is a first electronic component,
wherein the conduit comprises a first conduit between the first electronic component and a second electronic component and a second conduit between a third electronic component and a fourth electronic component, and
wherein the heat transfer device comprises a first heat transfer device proximate to the first electronic component opposite the first conduit, a second heat transfer device between the second and third electronic components, and a third heat transfer device proximate to the fourth component, opposite the second conduit.

17. The cooling system of claim 12, wherein the electronic component is a first electronic component,
wherein the conduit is between the first electronic component and a second electronic component, and
wherein the heat transfer device comprises a first heat transfer device proximate to the first electronic component, opposite the conduit, and a second heat transfer device proximate to the second electronic component, opposite the conduit.

* * * * *